United States Patent [19]
Tanabe et al.

[11] 4,156,276
[45] May 22, 1979

[54] EFFECTIVE VALUE CONVERTING CIRCUIT

[75] Inventors: Tomoyuki Tanabe; Eiji Hayashi; Masaaki Nishijo, all of Musashino, Japan

[73] Assignee: Yokogawa Electric Works, Ltd., Tokyo, Japan

[21] Appl. No.: 775,375

[22] Filed: Mar. 7, 1977

[30] Foreign Application Priority Data

Mar. 8, 1976 [JP] Japan .......................... 51/27168[U]
Mar. 8, 1976 [JP] Japan .......................... 51/27169[U]

[51] Int. Cl.² .................................................. H02M 7/06
[52] U.S. Cl. .................................... 363/126; 307/321; 324/119
[58] Field of Search ............... 307/321; 324/119, 132; 328/26; 363/125, 126

[56] References Cited
U.S. PATENT DOCUMENTS

| | | | |
|---|---|---|---|
| 2,452,551 | 11/1948 | Conant | 324/119 X |
| 2,829,343 | 4/1958 | Miller | 324/119 X |
| 2,915,706 | 12/1959 | Zwicker et al. | 324/119 X |
| 3,281,689 | 10/1966 | Schneider et al. | 324/119 X |
| 3,488,592 | 1/1970 | Nagy, Jr. | 324/119 |

Primary Examiner—William M. Shoop
Attorney, Agent, or Firm—Parmelee, Johnson, Bollinger & Bramblett

[57] ABSTRACT

An effective-value converting circuit comprising a rectifier circuit of which four arms are composed of diodes to rectify an a-c input, a temperature compensating diode connected between the output terminals of the rectifier circuit in series with a plurality of resistance elements for principally determining break points, a resistance element whose one terminal is connected with one output terminal of the rectifier circuit and whose other terminal is connected with the other output terminal of the rectifier circuit through an integrating capacitor so as to determine the fundamental inclination of a broken line, and series circuits consisting of inclination-determining resistance elements and diodes connected respectively between the integrating capacitor and the individual voltage-division points of the inclination-determining resistance elements. In the above converting circuit, the improvement is characterized in that a non-linearity compensating resistance element is connected between the input terminals of the rectifier circuit.

5 Claims, 9 Drawing Figures

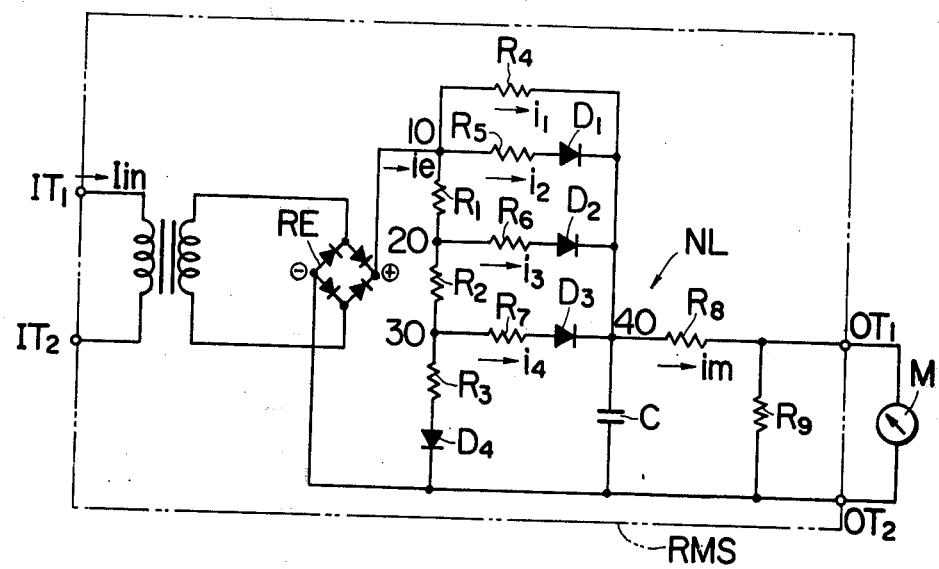
FIG. 1
FIG. 2
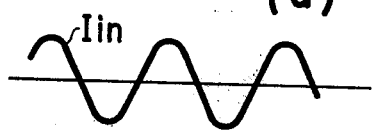
(a)
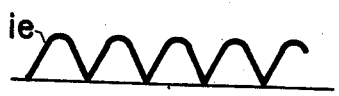
(b)
FIG. 3
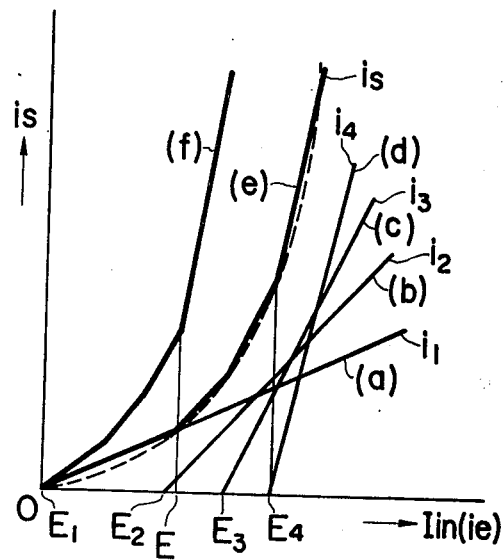

EFFECTIVE VALUE CONVERTING CIRCUIT

BACKGROUND OF THE INVENTION

1. Field of the Invention

The present invention relates to an effective-value converting circuit adapted to convert an a-c input voltage or current into a d-c signal proportional to the effective value of the input.

2. Description of the Prior Art

For measurement of an a-c voltage or current, normally available is a rectifier type instrument which rectifies an a-c input by a rectifier and then feeds it to a moving-coil type meter to indicate the input value. In such a rectifier type instrument, it is possible to achieve a high sensitivity and a high accuracy since the principle of operation is the same as that of the moving-type meter. By virtue of this merit, the rectifier type instrument is widely employed for measuring a-c voltage or current. When a sine-wave a-c input having an effective value Iin is fed to this instrument, its pointer indicates the mean value $(2\sqrt{2}/\pi)$Iin of the input current Iin. In general, as the a-c value used practically is the effective one, it is ordinary that the scale of the rectifier type instrument is graduated to show a value obtained through multiplying the intrinsic indication by a form factor $(\pi/2\sqrt{2})$ so that the sine-wave effective value Iin is directly readable. Due to such principle of operation, the form factor fails to become $\pi2\sqrt{2}$ in the rectifier type instrument when there is any distortion in the a-c input waveform to be measured, hence causing an indication error. In order to attain accurate measurement of the a-c input without undesired influence of distortion, an effective-value indicating type instrument is necessary. To meet this requirement, there is available a moving-iron type meter which is capable of directly indicating the effective value of the a-c input to be measured, thereby causing no waveform error unlike in the rectifier type instrument. On the other hand, while the moving-iron type meter features the above-described merit, an extremely high sensitivity is not achievable as viewed from its structure. Furthermore, it has another disadvantage that an indication error may occur depending on the frequency of an input to be measured. Thus, there exist some demerits in both the rectifier type and moving-iron type instruments serving as a-c measuring means.

Recently an improved effective-value converting circuit has become available, in which an a-c input to be measured is rectified by a rectifier circuit and then is fed to a nonlinear circuit consisting of resistors and diodes and a capacitor so as to obtain a d-c output signal proportional to the effective value of the a-c input. By connecting this effective-value converting circuit with a moving-coil type meter to indicate an a-c input, it is possible to accomplish a high-sensitivity, high-accuracy instrument free from waveform error, that is, an improved a-c measuring instrument having advantages of both the conventional rectifier type and moving-coil type instruments. However, in the effective-value converting circuit employing a nonlinear circuit, the d-c output signal obtained in the case of a low input is not satisfactory in its linearity, as will be described afterward. Accordingly, in constituting an a-c measuring instrument through combination of the above effective-value converting circuit with a moving-coil type meter, there arises a problem that its scale graduations fail to be uniform. Concerning the unsatisfactory linearity, the condition is the same as in the conventional rectifier type instrument or even worse particularly in the moving-iron type instrument. Although the rectifier type or moving-iron type instrument has various demerits as already mentioned, problematical points are minimum in the a-c instrument using an effective-value converting circuit with a nonlinear circuit. Therefore, on condition that the problem of linearity is solved the instrument equipped with an effective-value converting circuit is considered to be ideal for measurement of a-c voltage or current.

The principal object of the present invention is, in an effective-value converting circuit employing a nonlinear circuit, to provide an improvement having excellent linearity by reforming the linearity of a d-c output with respect to an a-c input.

Another object of the invention resides in providing an improved effective-value converting circuit having uniform scale graduations in an instrument constituted through combination of a moving-coil type meter with an effective-value converting circuit including a nonlinear circuit.

And a further object of the invention is, in an instrument composed of a moving-coil type meter with an effective-value converting circuit including a nonlinear circuit, to provide an improved converting circuit having such characteristics that the scale graduations are uniform up to a certain input value and are suppressed for an input exceeding the said certain value.

SUMMARY OF THE INVENTION

An effective value converting circuit includes a diode rectifier, a resistance element and an integrating capacitor in series between the output terminals of said diode rectifier, a break point determining resistance circuit and a temperature compensating diode in series between the output terminals of the diode rectifier and diode circuits connected between voltage division points of the break point determining resistance circuit and said integrating capacitor. In accordance with the invention in one of its aspects, low signal nonlinearity in the output resulting from turn-on and turn-off of the temperature compensating diode is compensated for by providing a nonlinearity compensating resistance element between terminals of the diode rectifier. The nonlinearity compensating resistance induces a nonlinear reduction in current flow through the diode rectifier to the capacitor. The resistance value of the compensating resistance is such that the nonlinear reduction in current offsets the nonlinearity caused by the temperature compensating diode.

In accordance with the invention in another of its aspects, a zener diode and a moving coil type indicating meter are connected in parallel with the integrating capacitor.

BRIEF DESCRIPTION OF THE DRAWINGS

FIG. 1 is an exemplary circuit diagram showing a conventional effective-value converting circuit;

FIGS. 2 through 4 illustrate waveforms respectively for explaining the operation of the circuit shown in FIG. 1;

Figure 4:
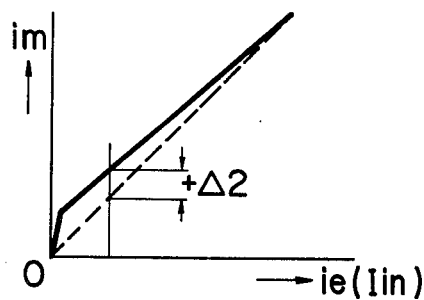

In the drawings, the reference symbols denote: R, R1–R9, R'8, R'9 . . . Resistance elements; D1–D4 . . . Diodes; C . . . Capacitor; M . . . Moving-coil type meter.

DESCRIPTION OF THE PREFERRED EMBODIMENTS:

First a description will be given on a conventional effective-value converting circuit with a nonlinear circuit. FIG. 1 is an exemplary circuit diagram of an a-c measuring instrument formed of a known effective-value converting circuit labeled as RMS and a moving-coil type meter labeled as M. In the effective-value converting circuit RMS: IT1 and IT2 are terminals to which an a-c input current Iin is applied; OT1 and OT2 are terminals from which a d-c output is obtained; CT is a current transformer; RE is a full-wave rectifier circuit whose four arms are composed of diodes; NL is a nonlinear circuit; R1–R3 are resistance elements for principally determining the break points of nonlinear circuit NL; R4–R7 are resistance elements for principally determining the inclination of nonlinear circuit NL, in which R4 serves to determine the fundamental of the inclination; D1–D3 are diodes for determining the break points of NL; D4 is a diode for effecting temperature compensation on the diodes D1–D3; C is an integrating capacitor; R8 is a series resistance element; and R9 is an output resistance element.

Input terminals IT1 and IT2 are connected to the primary coil of current transformer CT, and its secondary coil is connected to the input terminals of rectifier circuit RE. The positive (+) terminal of rectifier circuit RE is connected to one end of each of resistance elements R1, R4 and R5 at a junction point 10, while the negative (−) terminal of RE is connected to the output terminal OT2 of RMS. The other end of resistance element R1 is connected to one end of resistance element R2 at a junction point 20, while the other end of resistance element R2 is connected to one end of resistance element R3 at a junction point 30, and the other end of resistance element R3 is connected to the output terminal OT2 through a diode D4 connected in the forward direction. The other end of resistance element R4 is connected to one end of capacitor C at a junction point 40, to which the other end of resistance element R5 is connected through a diode D1 connected in the forward direction. Similarly, one end of resistance element R6 and that of R7 are connected to the junction points 20 and 30 respectively, while the other ends of R6 and R7 are connected to the junction point 40 through diodes D2 and D3 connected in the forward direction. Furthermore, one end of resistance element R8 is connected to the junction point 40, while its other end is connected to the output terminal OT1 and also to one end of resistance element R9, whose other end is connected to the output terminal OT2 together with the other end of capacitor C1. And the moving-coil type meter M is connected between the output terminals OT1 and OT2.

In the effective-value converting circuit of FIG. 1 where a moving-coil type meter M is thus connected, when a sine-wave input current Iin such as shown in FIG. 2(a) is applied to the terminals IT1 and IT2, the input current is transformed suitably by means of current transformer CT and then is fed to rectifier circuit RE to become ie through full-wave rectification. The current ie thus rectified flows from the junction point 10 via resistance element R4 to capacitor C, which is charged by the d-c component of the current labeled as i1. The capacitance value of capacitor C is selected properly so as not to cause ripple on its charge voltage. The relation between the current i1 and the voltage E1 charged in capacitor C by the current i1 is plotted as a straight line (a) in FIG. 3. When the charge voltage E1 of capacitor C reaches a fixed value, diode D4 comes to conduct so that the rectified current ie flows also from the junction point 10 to a series circuit consisting of resistance elements R1, R2 and R3. In this case, if the value of input current Iin or rectified current ie is small and the potential at the junction point 10 is below the terminal voltage E1 of capacitor C, none of the diodes D1, D2 and D3 conducts so that no current flow is permitted in resistance elements R5, R6 and R7. When the input current Iin increases and the rectified current ie becomes greater to cause an increase of the current flowing in the series circuit of resistance elements R1, R2 and R3, then the voltage drop occurring at the junction points 10, 20 and 30 also increases proportionally. In the state where the voltage drop at the junction points 20 and 30 is below the terminal voltage E1 of capacitor C while the voltage drop at the junction point 10 is above E1, first the diode D1 conducts to permit a current flow in resistance element R5, and this current flows into capacitor C together with the current i1 flowing through resistance element R4, thereby charging capacitor C. The charge voltage E2 of capacitor C obtained by the current i2 that flows through resistance element R5 is plotted as a straight line (b) in FIG. 3. When the current ie becomes further greater to increase the voltage drop at the junction points 20 and 30 beyond the capacitor terminal voltage, the diodes D2 and D3 conduct in sequence and permit currents i3 and i4 to flow through resistance elements R6 and R7, thereby further charging the capacitor C. Regarding the capacitor terminal voltage E3 and E4 obtained by the currents i3 and i4 respectively, the relation between E3 and i3 is plotted as (c) in FIG. 3, and the relation between E4 and i4 is plotted as (d). Accordingly, the relation between the input current Iin and the total current is (=i1+i2+i3+i4) indicates square characteristic as shown by a curve (e) in FIG. 3. This relation is represented by the following equation.

$$is = k1 \, Iin^2 \qquad (1)$$

where k1 is a constant.

Supposing now each constant of the nonlinear circuit NL is set selectively in the manner that the circuit NL operates on a certain capacitor terminal voltage (for example, E) lower than E4, the relation between Iin and is at the terminal voltage E4 is such as shown by a curve (f) in FIG. 3. As will be obvious from curves (e) and (f) of FIG. 3, the total current is related to the input current Iin is in inverse proportion to the capacitor terminal voltage E4. Therefore, this relation is expressed as $$is = k2/E4 \, Iin^2 \qquad (2)$$

where k2 is a constant.

A d-c current im represented by the following equation flows through resistance element R8 due to the voltage E4 charged in capacitor C.

$$im = \frac{1}{T} \int_O^T is\, dt = \frac{k2}{E4} \cdot \frac{1}{T} \int_O^T Iin(t)\, dt \quad (3)$$

where T is the period of input current Iin.

In relation to an internal resistance RM of the moving-coil type meter M including resistance elements R8 and R9, im is expressed as E4/RM. Accordingly, from Equation (3), $$E4^2 = RM\, k2 \frac{1}{T} \int_O^T Iin^2(t)\, dt \quad (4)$$

$$E4 = \sqrt{k3 \frac{1}{T} \int_O^T Iin^2(t)\, dt}$$

where k3 is a constant.

Thus, the capacitor terminal voltage E4 becomes equal to the effective value Iin RMS of the input current Iin. Consequently the voltage drop caused across the output resistance element R9 by the d-c current im resulting from the capacitor terminal voltage E4 becomes proportional to the effective value of input current Iin. It means that when the moving-coil type meter M is not connected, a d-c voltage proportional to the effective value of input current Iin is obtained from the output terminals OT1 and OT2. And in the case where the meter M is connected, it indicates the effective value of input current Iin.

As described hereinabove, since effective-value indication is effected in an a-c instrument where a moving-coil type meter is connected to an effective-value converting circuit using a nonlinear circuit NL, any distortion contained in the a-c input current Iin to be measured is substantially negligible in an indication error. And a high sensitivity is achievable owing to that the principle of operation is the same as that of the moving-coil type meter. In the converting circuit of FIG. 1, a temperature rise causes a decrease of the forward voltage drop in the diodes D1, D2 and D3 of nonlinear circuit NL, but also causes a decrease of the forward voltage drop simultaneously in the diode D4. For this reason, the d-c output current im never varies with temperature. In other words, no indication error results from temperature fluctuation. Although the circuit of FIG. 1 has such features, there still exists a disadvantage as already mentioned that, within a range where the input current Iin is small, the d-c output current im fails to be in linear proportion to the input current Iin. This fact is based on the following reason. In a range where the rectified current ie is small and the capacitor terminal voltage is low in the nonlinear circuit NL, diode D4 remains in a nonconducting state so that ie passes through resistance element R4 to become a current im. And when the capacitor terminal voltage rises beyond the forward voltage drop in diode D4, the rectified current ie is diverted to the resistance element R4 and the series circuit consisting of resistance elements R1, R2 and R3. Consequently, after conduction of diode D4, the rate of increase of the d-c output current im against that of the rectified current ie is lowered in comparison with the rate in the range where the capacitor terminal voltage does not exceed the forward voltage drop in diode D4. This relation is represented by the solid line in FIG. 4, where the dotted line plots an instance that im and ie are in linear proportion. In this way, the relation between the a-c input and the d-c output is not linear in the effective-value converting circuit RMS (root means square) shown in FIG. 1. Therefore, in an a-c instrument constituted by connecting a meter M to the effective-value converting circuit RMS of FIG. 1, the scale graduation of the meter M fails to have a uniform distribution in the manner that the graduation intervals tend to be wider in a range of small input Iin than in a range of large input.

The gist of the present invention resides in improving the effective-value converting circuit of FIG. 1 in an attempt to eliminate the above-described defects.

Figure 5:
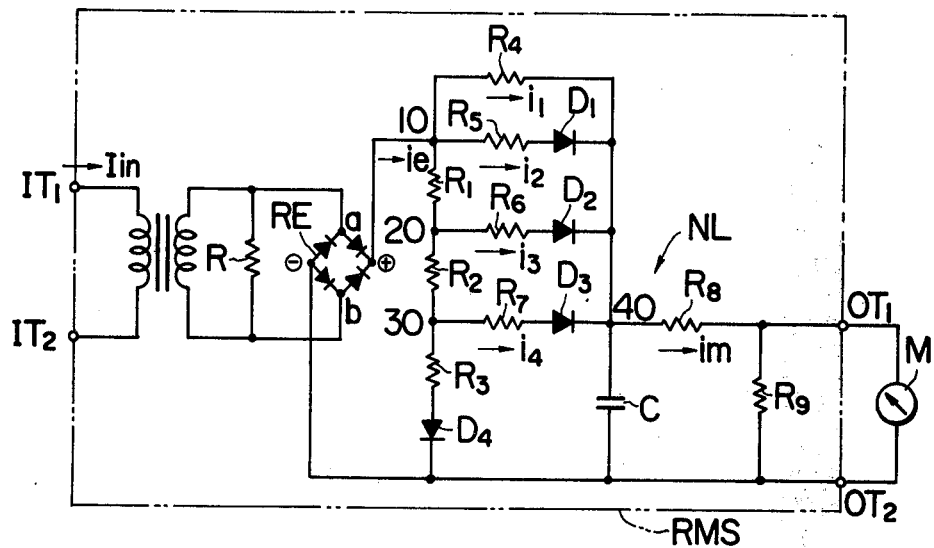
FIG. 5 is a circuit diagram embodying the effective-value converting circuit of the present invention.
Figure 6:
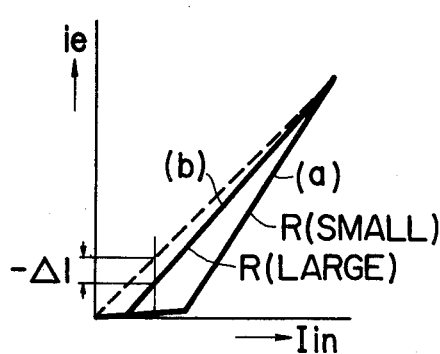
FIG. 6 is a graphic representation of waveform for explaining the operation of the circuit of FIG. 5.

The circuit diagram of FIG. 5 shows an instrument formed by connecting a moving-coil type meter M to the effective-value converting circuit of the present invention. In this drawing, the same component elements as those in FIG. 1 are labeled the same reference symbols, and reexplanation for them is omitted here. In FIG. 5, the point different from FIG. 1 is that a resistance element R is inserted and connected between the input terminals a and b of the rectifier circuit RE. In the effective-value converting circuit of FIG. 5 where a resistance element is inserted, d-c output current im comes into linear proportion to a-c input current Iin in the following manner. If the value of resistance element R is infinite (i.e. the same state as in the circuit of FIG. 1), input current Iin and rectified current ie are in the relation of linear proportion. When the resistance element R is connected, the secondary current of current transformer CT is diverted thereto. Meanwhile, at the time of rectification in the rectifier circuit RE, two diodes are connected in series in the forward direction. These rectifier diodes remain in the nonconducting state unless a voltage drop greater than a fixed value occurs across the resistance element R. Therefore, in the case where the value of resistance element R is small and the input current Iin is also small, the voltage drop occurring across the resistance element R is insufficient to cause conduction of the rectifier diodes. The relation between input current Iin and rectified current ie is plotted as (a) in FIG. 6. Since the current transformer CT can be regarded as a constant-current source, if the resistance element R has a large value, a great voltage drop is induced even by a current equivalent to the one supplied to the resistance element R in the case of a small resistance value. Accordingly, if this element R has a large value, a small input current Iin causes a flow of rectified current ie. This relation is represented by (b) in FIG. 6, where the dotted line plots an ideal instance that the input current Iin and the rectified current ie are in linear proportion. In comparison with this ideal straight line, practically the rectified current is accompanied by a negative error $-\Delta 1$ against the input current Iin for the reason mentioned above. The value of error $-\Delta 1$ varies in accordance with the value of resistance element R, as shown graphically in FIG. 6. In the meanwhile, as plotted in FIG. 4, the d-c current im produces a positive error $+\Delta 2$ against the rectified current ie. Therefore, if the value of resistance element R is so selected that the absolute value $|\Delta 1|$ of the negative error becomes equal to the absolute value $|\Delta 2|$ of the positive error, then $\Delta 1$ and $\Delta 2$ cancel each other to establish a relation of linear proportion between the a-c input current Iin and the d-c output current im. This output current is obtained from output terminals OT1 and OT2 through resistance element 9. Accordingly, in a moving-iron type meter M connected to the output terminals OT1 and OT2 as illustrated, the deflection becomes linear with respect to the a-c input current Iin to be measured, and thus the graduation distribution is rendered uniform.

As described hereinabove, in an a-c instrument constituted by connecting a moving-coil type meter M to the effective-value converting circuit of the present invention, it is possible to attain a uniform distribution of graduations. Moreover, by virtue of its being effective-value indication type, no indication error occurs regardless of the waveform of a-c input current to be measured. Furthermore, an a-c instrument obtainable offers a high sensitivity and is free from such an indication error that results from temperature fluctuation.

Figure 7:
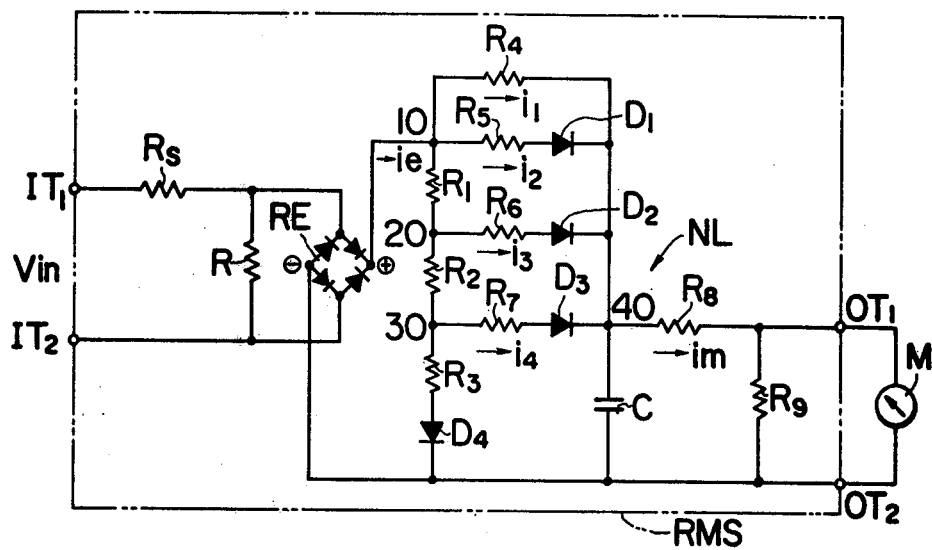
FIGS. 7 and 8 are circuit diagrams showing further embodiments of the invention.

FIG. 7 is a circuit diagram showing another embodiment of the invention, in which an input voltage Vin to be measured is converted into an effective-value output im. In this circuit, Rs is a series resistance element, and R is a nonlinearity compensating resistance element already explained with reference to FIG. 5. On the same grounds as stated for the circuit of FIG. 5, the circuit of FIG. 7 is capable of converting an a-c input voltage Vin into a proportional effective-value signal im with excellent linearity, and the scale graduations of a meter M connected thereto have a uniform distribution.

Figure 9:
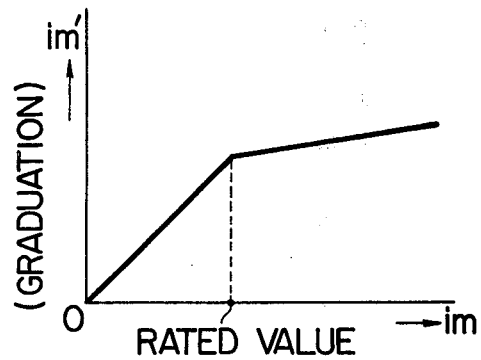
FIG. 9 is a graphic representation between the a-c input current and the d-c output current for the circuit shown in FIG. 8.
Figure 8:
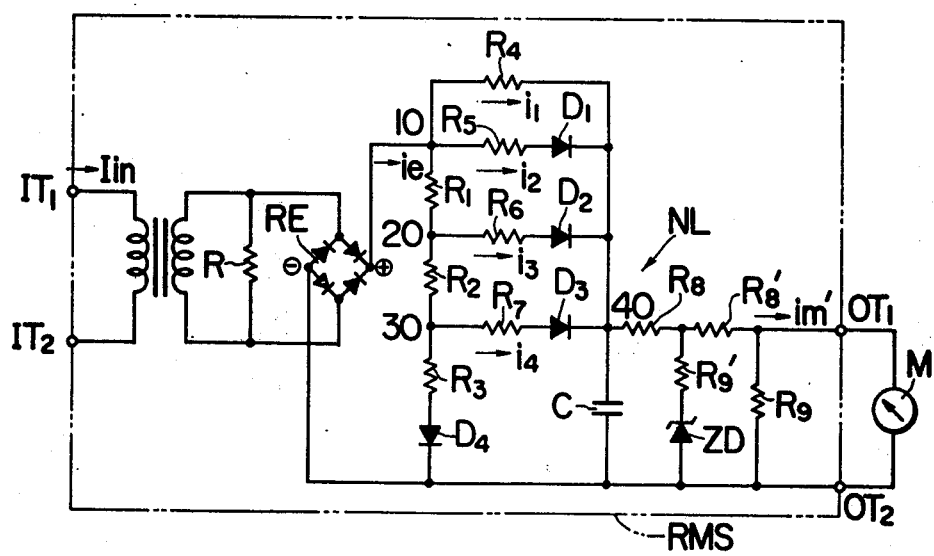

The circuit diagram of FIG. 8 shows a further embodiment implementing the present invention. This circuit is formed by connecting a zener diode ZD and a resistance element R9' additionally to the output terminal of capacitor C in the circuit of FIG. 5. In FIG. 8, breakdown of zener diode ZD occurs when the capacitor terminal voltage exceeds the zener voltage of ZD. The relation between the a-c input current Iin and the d-c output current im is such as plotted graphically in FIG. 9. Accordingly, an a-c instrument having extended scale graduations is accomplished by connecting a moving-coil type meter M between the output terminals OT1 and OT2 as illustrated in FIG. 8.

In each of the foregoing embodiments, a nonlinearity compensating resistance element R is connected on the input side of rectifier circuit RE. However, the same effect as that in the circuit of FIG. 5 is also achievable if the element R is connected on the output side. Moreover, although three resistance elements (R1, R2, R3) are employed in the above embodiments for principally determining the break points, it is to be noted that the number of such elements is not limited to three alone, and an increased number of the elements generate more break points to bring the broken line closer to square characteristic, thereby providing a high-accuracy effective-value converting circuit. In this case, according to the number of break points, it is necessary to increase the number of diodes D1, D2, D3 and that of resistance elements R5, R6, R7 serving to determine the inclination of the line. Furthermore digital indication of an input is also attainable by using a digital voltmeter instead of the moving-coil type meter M employed in the above-described embodiments.

What is claimed is:
1. An effective-value converting circuit comprising:
a rectifier circuit including four arms of diodes to rectify an ac input;
a resistance series circuit including a plurality of resistance elements connected with each other in series for determining break points of an output relative to an input;
a temperature compensating diode connected between the output terminals of said rectifier circuit through said resistance series circuit, so as to be forward biased by the output of said rectifier circuit;
a resistance element having one terminal connected with one output terminal of said rectifier circuit and the other terminal connected with the other output terminal of said rectifier circuit through an integrating capacitor so as to determine the fundamental inclination of said output relative to said input;
a plurality of resistance elements, each of the elements being connected between one of a plurality of voltage-division points of said resistance series circuit and said integrating capacitor so as to determine the inclination of said output;
a plurality of diodes connected in series with respective ones of said plurality of resistance elements so as to be forward biased by the voltages produced at respective voltage-division points of said resistance series circuit;
a nonlinearity compensating resistance element connected between the input terminals of said rectifier circuit, and of a resistance value which compensates for nonlinearity in said output resulting from differences in current flow to said integrating capacitor with turn-on and turn-off of said temperature compensating diode; and
a moving-coil type indicating meter having a uniform graduation connected with the output side of said integrating capacitor.

2. The effective value converting circuit as claimed in claim 1 wherein a zener diode is connected in parallel with said moving-coil type indicating meter at the output side of said integrating capacitor.

3. An effective-value converting circuit comprising:
a diode rectifier for rectifying an ac input;
at least one resistance circuit in series with a temperature compensating diode between the output terminals of said diode rectifier;
a resistance element in series with an integrating capacitor between the output terminals of said diode rectifier;
diode circuits connected between voltage-division points of said at least one resistance circuit and said integrating capacitor for determining break points of the converting circuit output; and
a nonlinearity compensating resistance element connected between terminals of said rectifier circuit, and of a resistance value which compensates for nonlinearity in said converting circuit output resulting from differences in current flow to said integrating capacitor with turn-on and turn-off of said temperature compensating diode.

4. An effective value converting circuit as claimed in claim 3 wherein said nonlinearity compensating resistance is connected across the input terminals of said diode rectifier.

5. The effective-value converting circuit as defined in claim 3, wherein a zener diode and a moving-coil type indicating meter are connected in parallel with the output side of said integrating capacitor.

* * * * *